(12) United States Patent
Uemura et al.

(10) Patent No.: US 7,719,337 B2
(45) Date of Patent: May 18, 2010

(54) SEMICONDUCTOR DEVICE

(75) Inventors: Taiki Uemura, Kawasaki (JP);
Yoshiharu Tosaka, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 0 days.

(21) Appl. No.: 12/252,954

(22) Filed: Oct. 16, 2008

(65) Prior Publication Data
US 2009/0108886 A1   Apr. 30, 2009

(30) Foreign Application Priority Data
Oct. 29, 2007   (JP) .............................. 2007-280774

(51) Int. Cl.
*H03K 3/00* (2006.01)
(52) U.S. Cl. .................... 327/218; 327/201; 327/215
(58) Field of Classification Search ............... 327/208, 327/210–212, 214, 215, 218, 199–201
See application file for complete search history.

(56) References Cited

U.S. PATENT DOCUMENTS

| | | | | |
|---|---|---|---|---|
| 6,026,011 | A * | 2/2000 | Zhang | 365/154 |
| 7,068,088 | B2 * | 6/2006 | Petersen | 327/208 |
| 7,265,596 | B2 * | 9/2007 | Kang et al. | 327/161 |
| 7,570,080 | B2 * | 8/2009 | Nintunze et al. | 326/95 |

* cited by examiner

*Primary Examiner*—Hai L Nguyen
(74) *Attorney, Agent, or Firm*—Arent Fox LLP

(57) ABSTRACT

A semiconductor device includes a circuit having a first data holding node and a second data holding node; a first MOS field-effect transistor coupled to the first data holding node; a second MOS field-effect transistor coupled to the second data holding node; and a clock generation circuit coupled to a first gate electrode of the first MOS field-effect transistor for outputting a clock signal, wherein the first gate electrode is coupled to the second data holding node via the second MOS field-effect transistor, and a second gate electrode of the second MOS field-effect transistor is coupled to the first data holding node via the first MOS field-effect transistor.

10 Claims, 14 Drawing Sheets

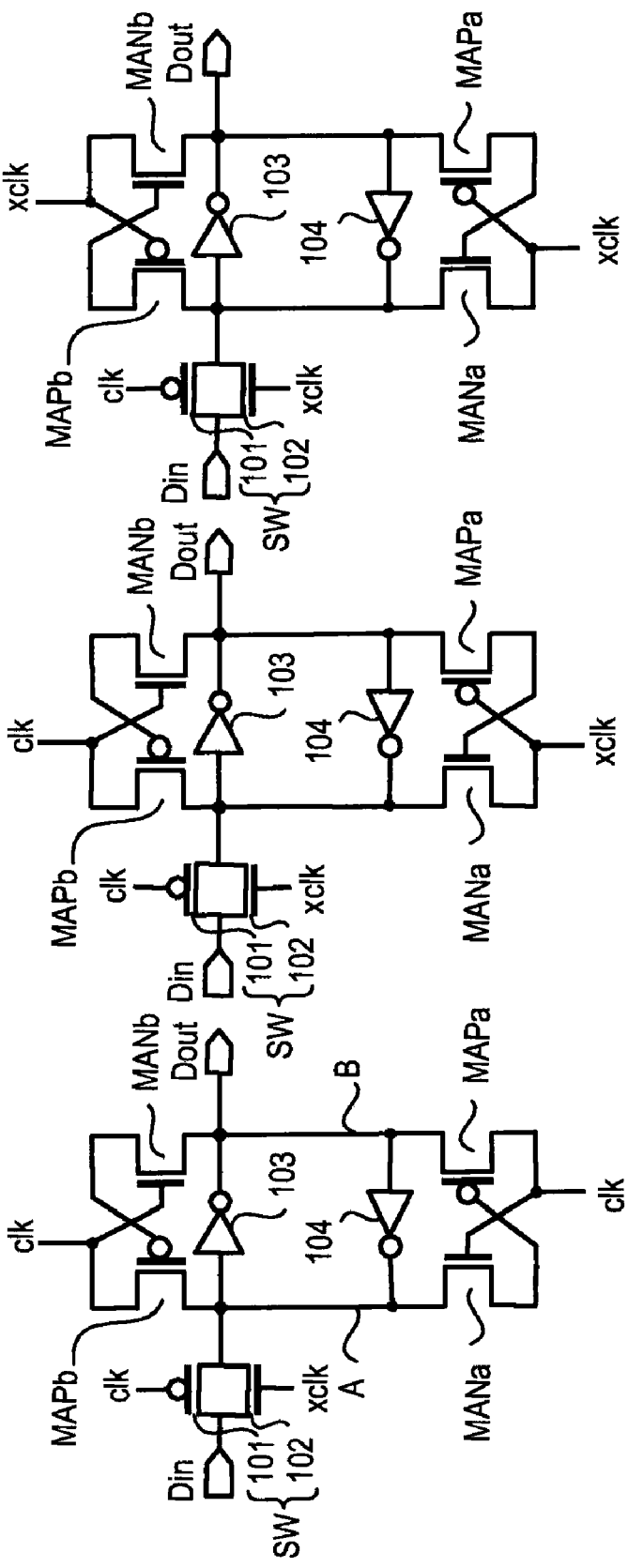

--Prior Art--

--Prior Art--

--Prior Art--

SEMICONDUCTOR DEVICE

CROSS-REFERENCE TO RELATED APPLICATION

This application is based upon and claims the benefit of priority from the prior Japanese Patent Application No. 2007-280774 filed on Oct. 29, 2007, the entire contents of which are incorporated herein by reference.

BACKGROUND

1. Field

The present invention relates to a semiconductor device.

2. Description of Related Art

Unlike a hard error that destroys a specific part of a circuit permanently, a soft error refers to a transitory, recoverable malfunction that randomly occurs in a semiconductor chip. The malfunction is attributable to incidence of neutron beams of secondary cosmic rays or alpha rays or the like from an LSI material upon an LSI.

Various measures for soft errors are currently being invented. One of most effective and common measures is a method of adopting a circuit configuration that prevents the occurrence of an error from influencing the system. For example, an ECC (Error Correction Code) can correct errors relatively easily. However, these measures or methods cause an increase in the area and are not applicable to a logic circuit. Therefore, if the soft error rate increases along with the degree of integration, there is a high probability that problems of soft errors may become more serious than ever.

A general soft error prevention means is described in Japanese Patent Laid-Open No. 2005-191454. This method adds a capacitance to a data holding node and thereby prevents data inversion caused by the occurrence of charge based on radiation. Applying this method to a latch circuit will cause performance deterioration in a setup time and delay time or the like.

Furthermore, Japanese Patent Laid-Open No. 10-335992 describes a semiconductor integrated circuit device provided with flip flops including first and second logic gates that make up a first latch by being substantially cross coupled, a third logic gate that makes up a second latch by being substantially cross coupled with the first logic gate or a fourth logic gate that makes up a third latch by being substantially cross coupled with the second logic gate.

Furthermore, Japanese Patent Laid-Open No. 2006-129477 describes a tri-state capable latch to reduce soft errors provided with a) a first inverter having an input and output and b) a second inverter having an input and output, wherein c) the input of the first inverter is connected to the output of the second inverter, d) the input of the second inverter is connected to the output of the first inverter, and e) when the input to the second inverter is blocked by a soft error event, the second inverter is set to a tri-state by a certain signal.

Furthermore, Japanese Patent Laid-Open No. 04-372214 describes a latch circuit including a first OR circuit, a first input terminal which receives a data signal and a second input terminal which receives a clock signal, a gate circuit that receives the clock signal and outputs the same logic as the clock signal, a second OR circuit, a first input terminal which receives the output of the first OR circuit and a second input terminal which receives the output of the gate circuit, a third OR circuit, a first input terminal which receives an inverted clock signal corresponding to the inverted clock signal and an AND circuit, a first input terminal which receives the output of the second OR circuit, a second input terminal which receives the output of the third OR circuit and the output which is supplied to a data output terminal and the second input terminal of the third OR circuit.

SUMMARY

According to an aspect of an embodiment, there is a semiconductor device including: a circuit having a first data holding node and a second data holding node; a first MOS field-effect transistor coupled to the first data holding node; a second MOS field-effect transistor coupled to the second data holding node; and a clock generation circuit that is coupled to a first gate electrode of the first MOS field-effect transistor and outputs a clock signal, wherein the first gate electrode is coupled to the second data holding node via the second MOS field-effect transistor, and a second gate electrode of the second MOS field-effect transistor is coupled to the first data holding node via the first MOS field-effect transistor.

BRIEF DESCRIPTION OF THE DRAWINGS

FIGS. 10A to 10C are circuit diagrams showing configuration examples of the semiconductor devices having a latch circuit according to ninth to eleventh embodiments;

DESCRIPTION OF THE PREFERRED EMBODIMENTS

Figure 12A:
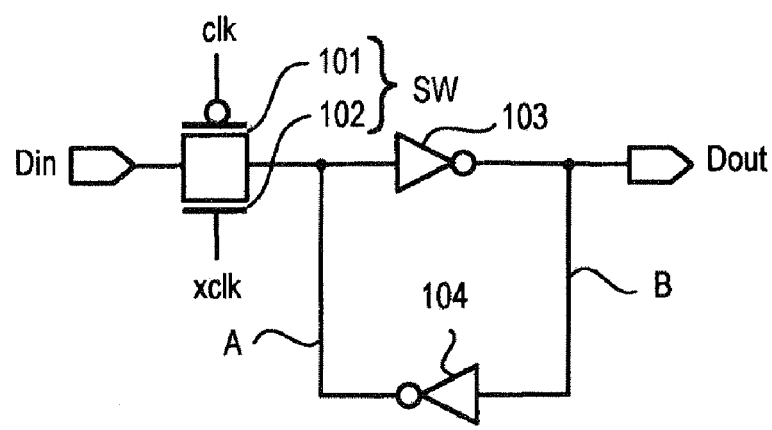
FIGS. 12A to 12C illustrate a latch circuit.
Figure 12B:
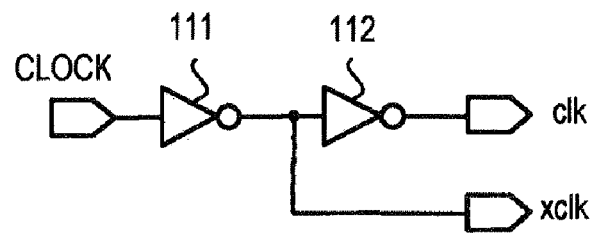
Figure 12C:
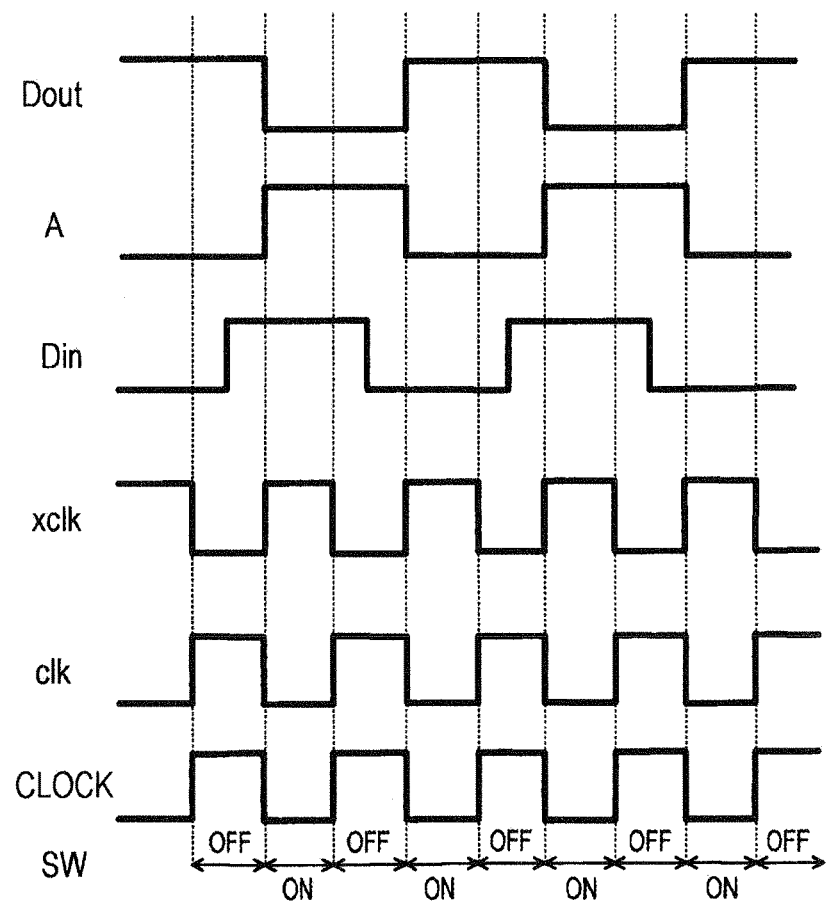

FIG. 12A is a circuit diagram showing a configuration example of a general latch circuit, FIG. 12B is a circuit diagram showing a configuration example of a clock generation circuit and FIG. 12C is a timing chart showing operations of the circuits in FIGS. 12A and B. Hereinafter, a MOS field-effect transistor will be simply referred to as a "transistor."

In FIG. 12A, a p-channel transistor 101 and an n-channel transistor 102 make up a switch SW. The gate of the p-channel transistor 101 is connected to a clock signal clk, and the source and drain are connected to a data input terminal Din and an input terminal of an inverter 103. The gate of the n-channel transistor 102 is connected to a clock signal xclk and the source and drain are connected to the data input terminal Din and the input terminal of the inverter 103. An output terminal of the inverter 103 is connected to a data output terminal Dout. The inverters 103 and 104 make up a latch circuit. An input terminal of the inverter 104 is connected to the output terminal of the inverter 103 and an output terminal is connected to the input terminal of the inverter 103. A data holding node A of the latch circuit is a mutual connection node of the input terminal of the inverter 103 and the output terminal of the inverter 104. A data holding node B of the latch circuit is a mutual connection node of the output terminal of the inverter 103 and the input terminal of the inverter 104.

In FIG. 12B, the clock generation circuit has inverters 111 and 112. The inverter 111 outputs a clock signal xclk resulting from inverting a reference clock signal CLOCK. The inverter 112 outputs a clock signal clk resulting from inverting the clock signal xclk. The clock signals clk and xclk are mutually inverted signals.

When the clock signal xclk becomes a high level and the clock signal clk becomes a low level, the transistors 101 and 102 turn ON and the switch SW turns ON. On the contrary, when the clock signal xclk becomes a low level and the clock signal clk becomes a high level, the transistors 101 and 102 turn OFF and the switch SW turns OFF.

When the clock signal xclk becomes a high level, the switch SW turns ON and the data input terminal Din and data holding node A are connected. The data of the data holding node A becomes the same as the data of the data input terminal Din.

When the clock signal xclk becomes a low level, the switch SW turns OFF and the data input terminal Din and data holding node A are disconnected. The inverter 103 inverts the data of the data holding node A and outputs the inverted data to the data holding node B. The inverter 104 inverts the data of the data holding node B and outputs the inverted data to the data holding node A. The inverters 103 and 104 make up a latch circuit and the data of the data holding nodes A and B are held. Since the data output terminal Dout is connected to the data holding node B, the data of the data output terminal Dout is the same as the data of the data holding node B. For a period during which the clock signal xclk is a low level, the switch SW remains OFF even when the data of the data input terminal Din changes, and therefore the data of the data holding nodes A and B are held.

As shown above, when the clock signal xclk is a high level, a data write state is set and when the clock signal xclk is a low level, a data holding state is set.

First Embodiment

Figure 1A:
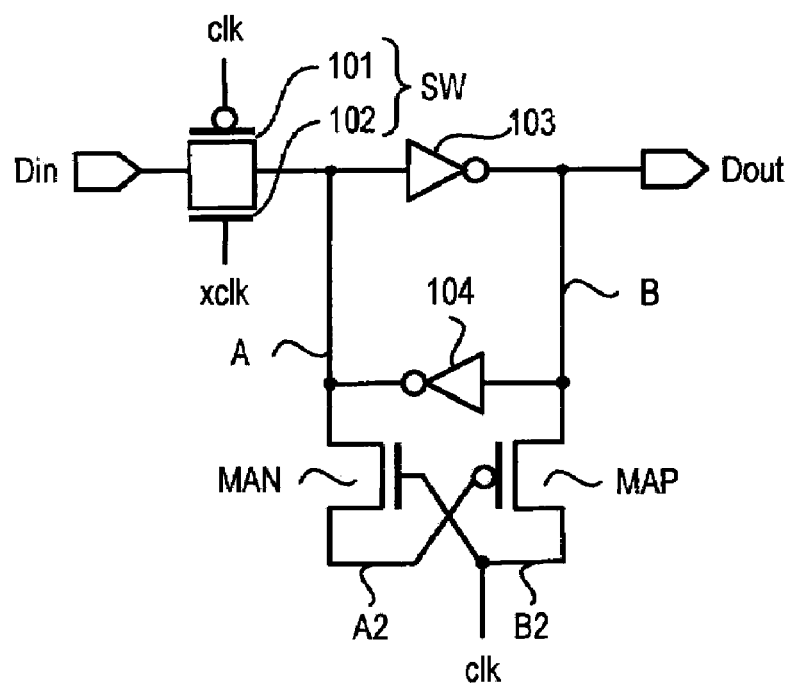
FIGS. 1A to 1C illustrate a semiconductor device according to a first embodiment.
Figure 1B:
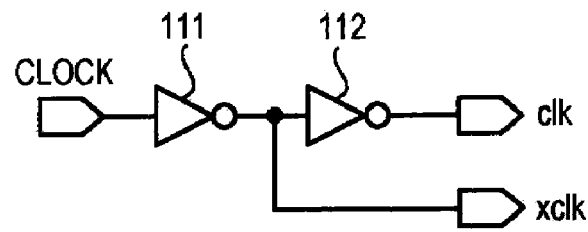
Figure 1C:
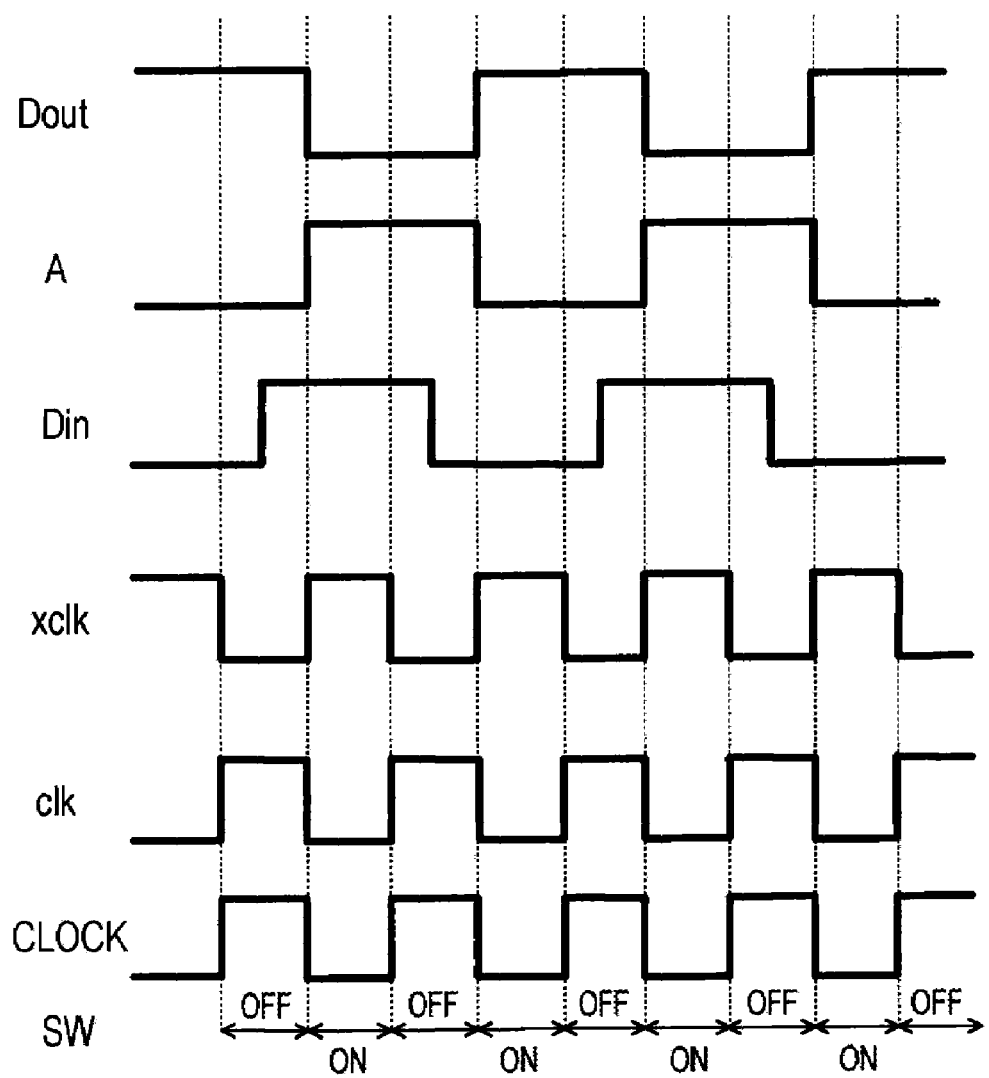

FIGS. 1A and 1B are circuit diagrams showing configuration examples of a semiconductor device according to a first embodiment. FIG. 1A is a circuit diagram showing a configuration example of a circuit having a latch circuit, FIG. 1B is a circuit diagram showing a configuration example of a clock generation circuit and FIG. 1C is a timing chart showing operations of the circuits in FIGS. 1A and 1B. Hereinafter, a MOS field-effect transistor will be simply referred to as a "transistor." The circuit in FIG. 1A corresponds to the circuit in FIG. 12A with transistors MAN and MAP added. Hereinafter, only the differences of FIG. 1A from FIG. 12A will be explained.

The gate of the n-channel transistor MAN is connected to the drain of the p-channel transistor MAP, the drain is connected to a data holding node A and the source is connected to the gate of the p-channel transistor MAP. The source of the p-channel transistor MAP is connected to a data holding node B. A clock signal clk is inputted to the gate of the transistor MAN. Node A2 is a node of the gate of the p-channel transistor MAP. Node B2 is a node of the gate of the n-channel transistor MAN.

The clock generation circuit in FIG. 1B has the same configuration as that of the clock generation circuit in FIG. 12B. The timing chart in FIG. 1C is the same as the timing chart in FIG. 12C.

Figure 2A:
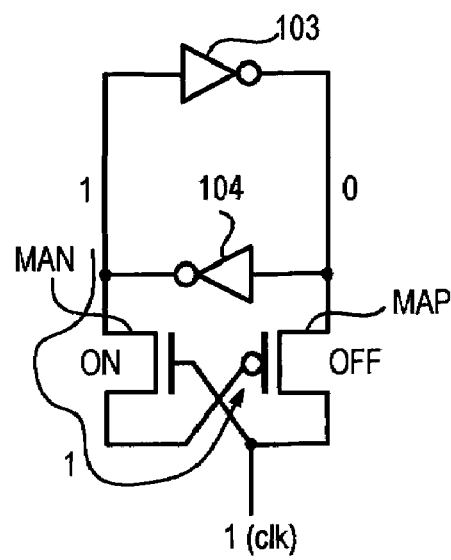
FIGS. 2A and 2B are circuit diagrams illustrating operations of the transistors MAN and MAP in FIG. 1A.
Figure 2B:
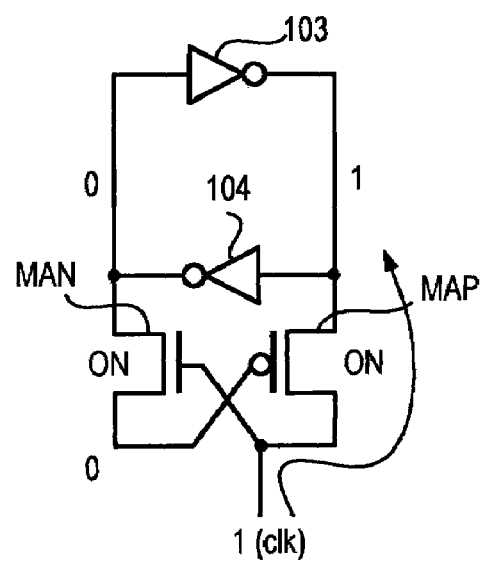

FIGS. 2A and 2B are circuit diagrams illustrating operations of the transistors MAN and MAP in FIG. 1A.

FIG. 2A is a circuit diagram when data "1" is held at the data holding node A and data "0" is held at the data holding node B. Here, data "1" is a high level and data "0" is a low level. When the clock signal clk is a high level (signal "1"), the switch SW turns OFF, data "1" is held at the data holding node A and data "0" is held at the data holding node B. Since the clock signal clk is a high level, the n-channel transistor MAN turns ON and the data holding node A is connected to the gate of the p-channel transistor MAP. Since the data of the data holding node A is also stored in a capacitance owned by this gate, it is possible to stably hold the data of the data holding node A and prevent soft errors of the data holding node A.

Furthermore, when the n-channel transistor MAN turns ON, the gate of the p-channel transistor MAP becomes a high level and the transistor MAP turns OFF.

As shown above, data "1" is written into the data holding node A and data "0" is written into the data holding node B. When a holding state is set, that is, when the clock signal clk changes from "0" to "1," since the node B2 is connected to the clock signal clk, data "1" is set and the n-channel transistor MAN turns ON. This causes the data holding node A to be connected to the node A2 and further connected to the gate of the transistor MAP, and therefore, the capacitance of this gate is added as the capacitance of the data holding node making the circuit resistant to noise. That is, the soft error resistance increases. Furthermore, the data holding node A and node A2 are connected and the potential of the node A2 is the same "1" as the data holding node A, the transistor MAP turns OFF and the data holding node B and node B2 are not connected.

FIG. 2B is a circuit diagram when data "0" is held at the data holding node A and data "1" is held at the data holding node B. When the clock signal clk is a high level (signal "1"), the switch SW turns OFF, data "0" is held at the data holding node A and data "1" is held at the data holding node B. Since the clock signal clk is a high level, the n-channel transistor MAN turns ON and the data holding node A is connected to the gate of the p-channel transistor MAP. Since the data of the data holding node A is also stored in the capacitance owned by this gate, the data of the data holding node A is stably held and it is possible to prevent soft errors of the data holding node A.

Furthermore, when the n-channel transistor MAN turns ON, the gate of the p-channel transistor MAP becomes a low level and the transistor MAP turns ON. The clock signal clk of "1" is then inputted to the data holding node B and it is possible to reinforce the holding of data "1" by the data holding node B. This causes data "1" of the data holding node B to be stably held, and can thereby prevent soft errors of the data holding node B.

As shown above, when data "0" is written into the data holding node A, data "1" is written into the data holding node B and a holding state is set, that is, when the clock signal clk changes from "0" to "1," since node B2 is connected to the clock signal clk, data "1" is set and the n-channel transistor MAN turns ON. This causes the data holding node A to be connected to node A2, further connected to the gate of the transistor MAP, and therefore the capacitance of this gate is added as the capacitance of the data holding node A, making the circuit resistant to noise. That is, the soft error resistance increases.

Furthermore, the data holding node A and node A2 are connected, the potential of node A2 is the same data "0" as the data holding node A, the transistor MAP is ON and the data holding node B and node B2 are connected. Since the data held by the data holding node B is "1" and node B2 has the potential of "1" like the clock signal clk, this supplements the holding of the data of the data holding node B, making the circuit resistant to noise. That is, the soft error resistance increases.

When the clock signal clk becomes "0," the switch SW turns ON and a data write state is set, the transistor MAN turns OFF. This causes the gate capacitance of the transistor MAP to be disconnected from the data holding node A, and can thereby prevent delays of the data write time. More specifically, it is possible to prevent performance deterioration in a setup time and delay time or the like.

This embodiment connects the clock signal clk to the data holding node B and thereby supplements data holding. Furthermore, this embodiment is effective when the data holding node B holds data "1" and is especially effective when the electric capacitance of the data holding node B is small.

Second Embodiment

Figure 3:
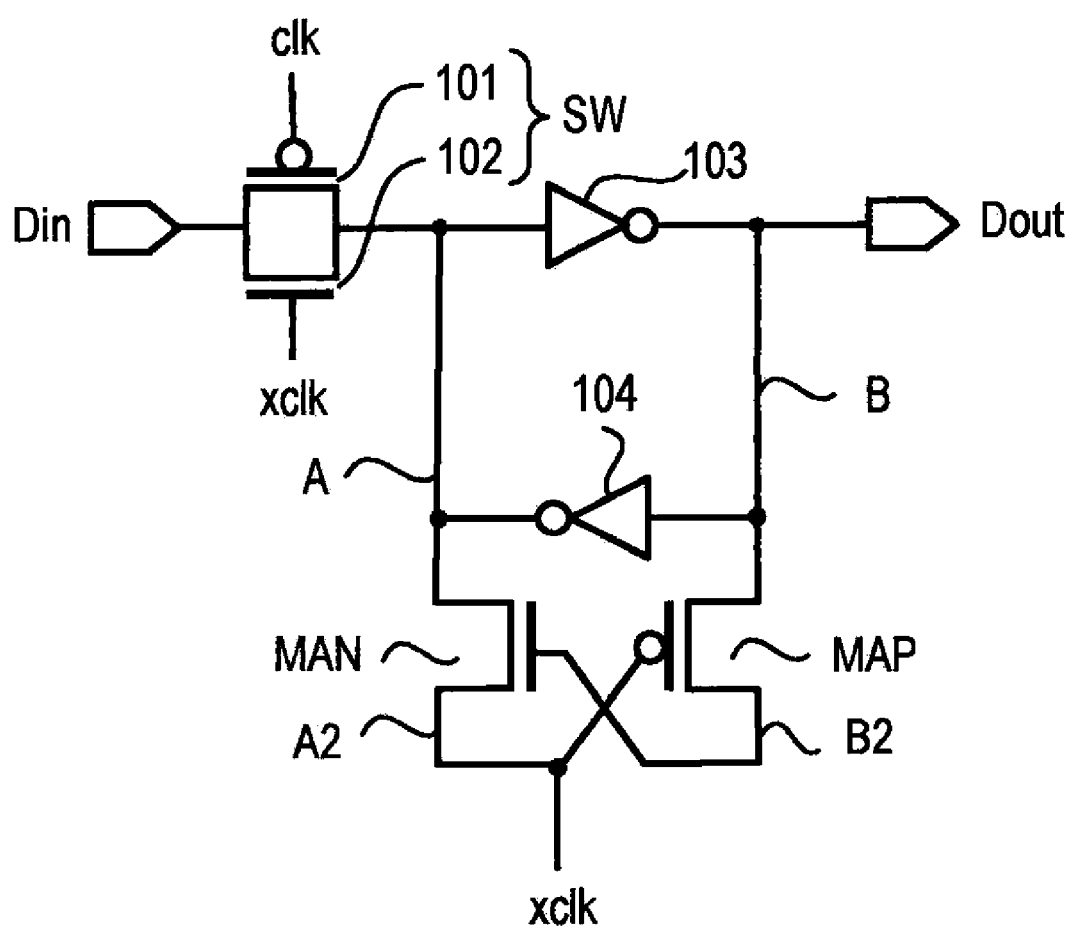
FIG. 3 is a circuit diagram showing a configuration example of a semiconductor device having a latch circuit according to a second embodiment.

FIG. 3 is a circuit diagram showing a configuration example of a semiconductor device having a latch circuit according to a second embodiment. Hereinafter, the differences of this embodiment from the first embodiment will be explained. Instead of inputting a clock signal clk to the gate of an n-channel transistor MAN, a clock signal xclk is inputted to the gate of a p-channel transistor MAP.

When the clock signal xclk changes from "1" to "0," a switch SW turns OFF and a data holding state is set. Since the clock signal xclk is "0," the p-channel transistor MAP turns ON, a gate capacitance of the transistor MAN is connected to the data holding node B, it is possible to prevent soft errors of the data holding node B.

When data "1" is held at the data holding node B, the transistor MAN turns ON. The data holding node A is then connected to the clock signal xclk. In this case, since data "0" is held at the data holding node A, the clock signal xclk of "0" supplements the data holding of the data holding node A. This can prevent soft errors of the data holding node A.

On the other hand, when data "0" is held at the data holding node B, the transistor MAN turns OFF and the data holding node A is disconnected from the clock signal xclk.

When the clock signal xclk becomes "1," the switch SW turns ON and a data write state is set, the transistor MAP turns OFF. This causes the gate capacitance of the transistor MAN to be disconnected from the data holding node B, and can thereby prevent a delay in the data write time. More specifically, it is possible to prevent performance deterioration in a setup time and delay time or the like.

This embodiment connects the clock signal xclk to the data holding node A and thereby supplements the data holding. Furthermore, this embodiment is effective when the data holding node A holds data "0" and especially effective when the electric capacitance of the data holding node A is small.

Furthermore, in the first embodiment, the p-channel transistor MAP connects the clock signal clk and data holding node B and forms a current path. On the other hand, in this embodiment, the n-channel transistor MAN connects the clock signal xclk and data holding node A and forms a current path. If this current path allows the same current to pass, the area of the n-channel transistor can be made smaller than that of the p-channel transistor. Therefore, the area of the circuit of this embodiment can be made smaller than the area of the circuit of the first embodiment.

Third Embodiment

Figure 4:
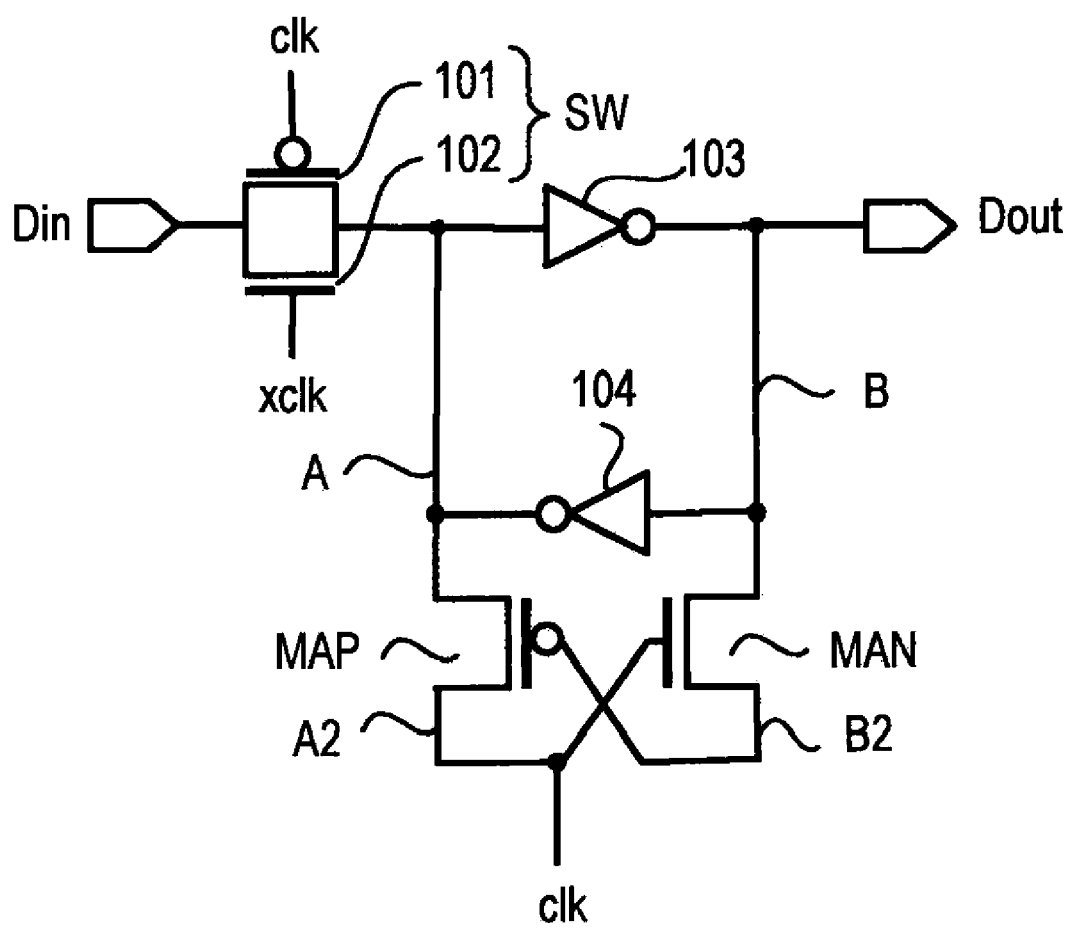
FIG. 4 is a circuit diagram showing a configuration example of a semiconductor device having a latch circuit according to a third embodiment.

FIG. 4 is a circuit diagram showing a configuration example of a semiconductor device having a latch circuit according to a third embodiment. Hereinafter, the differences of this embodiment from the first embodiment will be explained. The circuit in FIG. 4 corresponds to the circuit in FIG. 1A with the n-channel transistor MAN and p-channel transistor MAP switched around. The gate of a p-channel transistor MAP is connected to the source of an n-channel transistor MAN, the source is connected to a data holding node A and the drain is connected to the gate of the n-channel transistor MAN. The drain of the n-channel transistor MAN is connected to a data holding node B. A clock signal clk is inputted to the gate of the transistor MAN. A node A2 is a node of the gate of the n-channel transistor MAN. A node B2 is a node of the gate of the p-channel transistor MAP.

When the clock signal clk changes from "0" to "1," a switch SW turns OFF and a data holding state is set. Since the clock signal clk is "1," the n-channel transistor MAN turns ON and a gate capacitance of the transistor MAP is connected to the data holding node B, and it is thereby possible to prevent soft errors of the data holding node B.

When data "0" is held at the data holding node B, the transistor MAP turns ON. The data holding node A is then connected to the clock signal clk. In this case, since data "1" is held at the data holding node A, the clock signal clk of "1" supplements the data holding of the data holding node A. This can prevent soft errors of the data holding node A.

On the other hand, when data "1" is held at the data holding node B, the transistor MAP turns OFF and the data holding node A is disconnected from the clock signal clk.

This embodiment connects the clock signal clk to the data holding node A and thereby supplements the data holding. Furthermore, this embodiment is effective when the data holding node A holds data "1" and is especially effective when the electric capacitance of the data holding node A is small.

Fourth Embodiment

Figure 5:
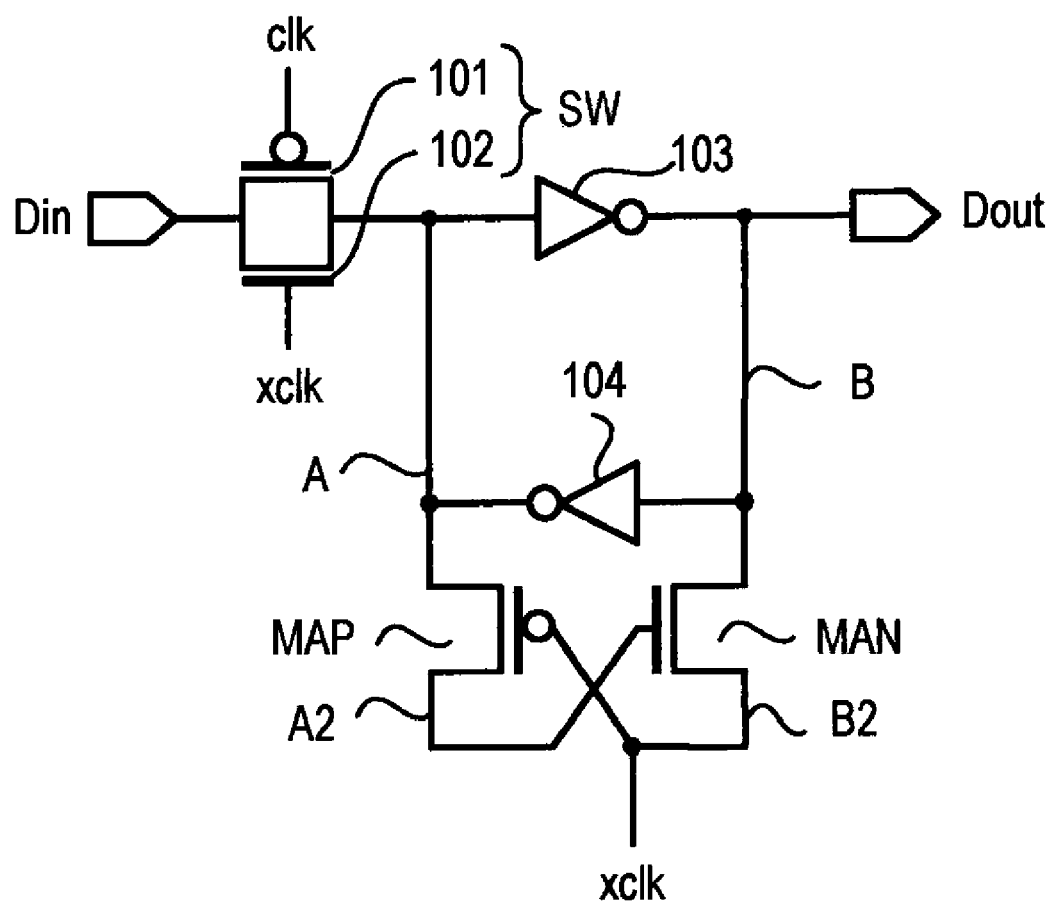
FIG. 5 is a circuit diagram showing a configuration example of a semiconductor device having a latch circuit according to a fourth embodiment.

FIG. 5 is a circuit diagram showing a configuration example of a semiconductor device having a latch circuit according to a fourth embodiment. Hereinafter, the differences of this embodiment from the third embodiment will be explained. Instead of inputting a clock signal clk to the gate of an n-channel transistor MAN, a clock signal xclk is inputted to the gate of a p-channel transistor MAP.

When the clock signal xclk changes from "1" to "0," a switch SW turns OFF and a data holding state is set. Since the clock signal xclk is "0," the p-channel transistor MAP turns ON and the gate capacitance of the transistor MAN is connected to a data holding node A, it is possible to prevent soft errors of the data holding node A.

When data "1" is held at the data holding node A, the transistor MAN turns ON. A data holding node B is then connected to the clock signal xclk. In this case, since data "0" is held at the data holding node B, the clock signal xclk of "0"

supplements the data holding of the data holding node B. This can prevent soft errors of the data holding node B.

On the other hand, when data "0" is held at the data holding node A, the transistor MAN turns OFF and the data holding node B is disconnected from the clock signal xclk.

This embodiment supplements the data holding by connecting the clock signal xclk to the data holding node B. Furthermore, this embodiment is effective when the data holding node B holds data "0" and is especially effective when the electric capacitance of the data holding node B is small.

Furthermore, in the third embodiment, the p-channel transistor MAP connects the clock signal clk and data holding node A and forms a current path. On the other hand, in this embodiment, the n-channel transistor MAN connects the clock signal xclk and data holding node B and forms a current path. If the same current is passed through this current path, the area of the n-channel transistor can be made smaller than the area of the p-channel transistor. Therefore, the area of the circuit of this embodiment can be made smaller than the area of the circuit of the third embodiment.

Fifth Embodiment

Figure 6:
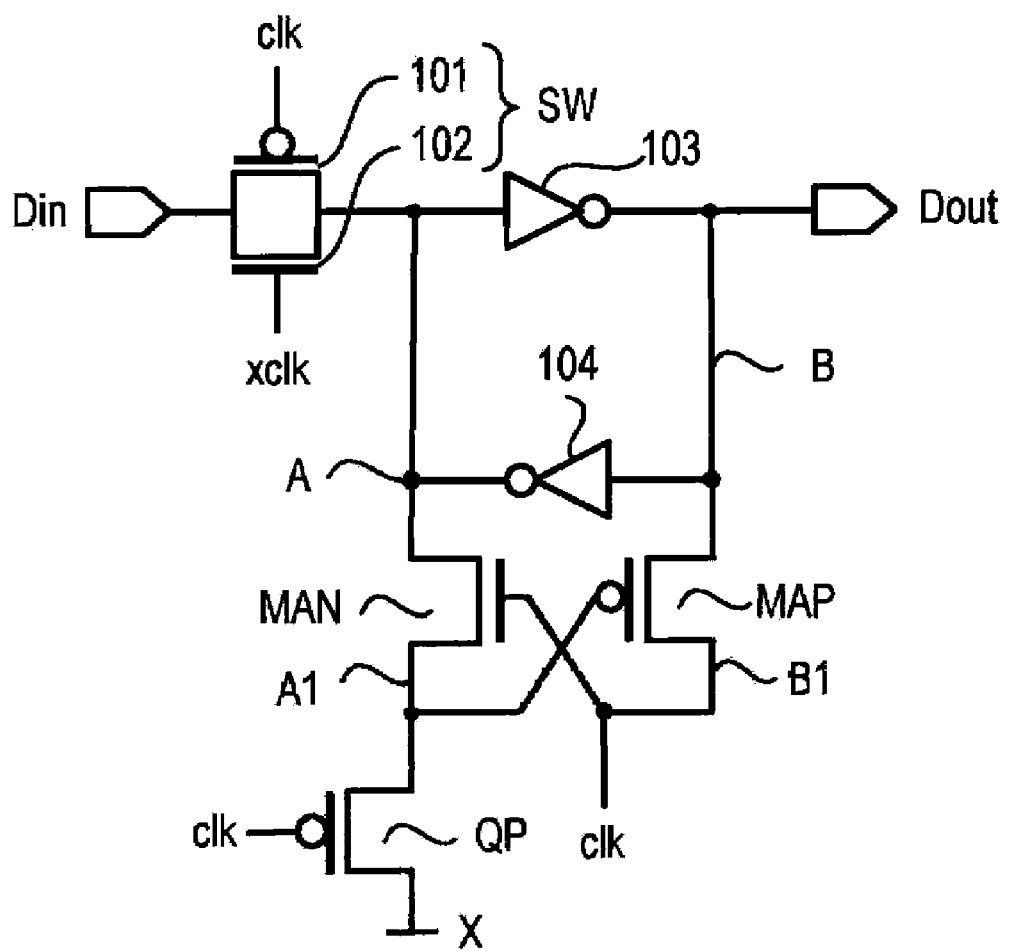
FIG. 6 is a circuit diagram showing a configuration example of a semiconductor device having a latch circuit according to a fifth embodiment.

FIG. 6 is a circuit diagram showing a configuration example of a semiconductor device having a latch circuit according to a fifth embodiment. Hereinafter, the differences of this embodiment from the first embodiment will be explained. The circuit in FIG. 6 corresponds to the circuit in FIG. 1A with a p-channel transistor QP added. The drain of the p-channel transistor QP is connected to the gate of a p-channel transistor MAP, the gate is connected to a clock signal clk and the source is connected to a node X. The node X is a node of a supply voltage (high level potential). Node A1 is a node of the gate of the p-channel transistor MAP. Node B1 is a node of the gate of an n-channel transistor MAN.

When the clock signal clk is "1," a switch SW turns OFF and a data holding state is set. At this moment, since the p-channel transistor QP turns OFF, the circuit becomes the same circuit in FIG. 1A and operates in the same way as in the first embodiment.

On the other hand, when the clock signal clk is "0," the switch SW turns ON and a data write state is set. At this moment, the transistor MAN turns OFF. Furthermore, the transistor QP turns ON and the high level node X is connected to the gate of the transistor MAP. This causes the transistor MAP to turn OFF. Since this ensures that the transistors MAN and MAP turn OFF, the data of the data input terminal Din can be stably written into the data holding nodes A and B.

Node X may also be a node of a clock signal xclk instead of the node of the supply voltage. The clock signal xclk is a signal which becomes a high level when the transistor QP is ON.

Sixth Embodiment

Figure 7:
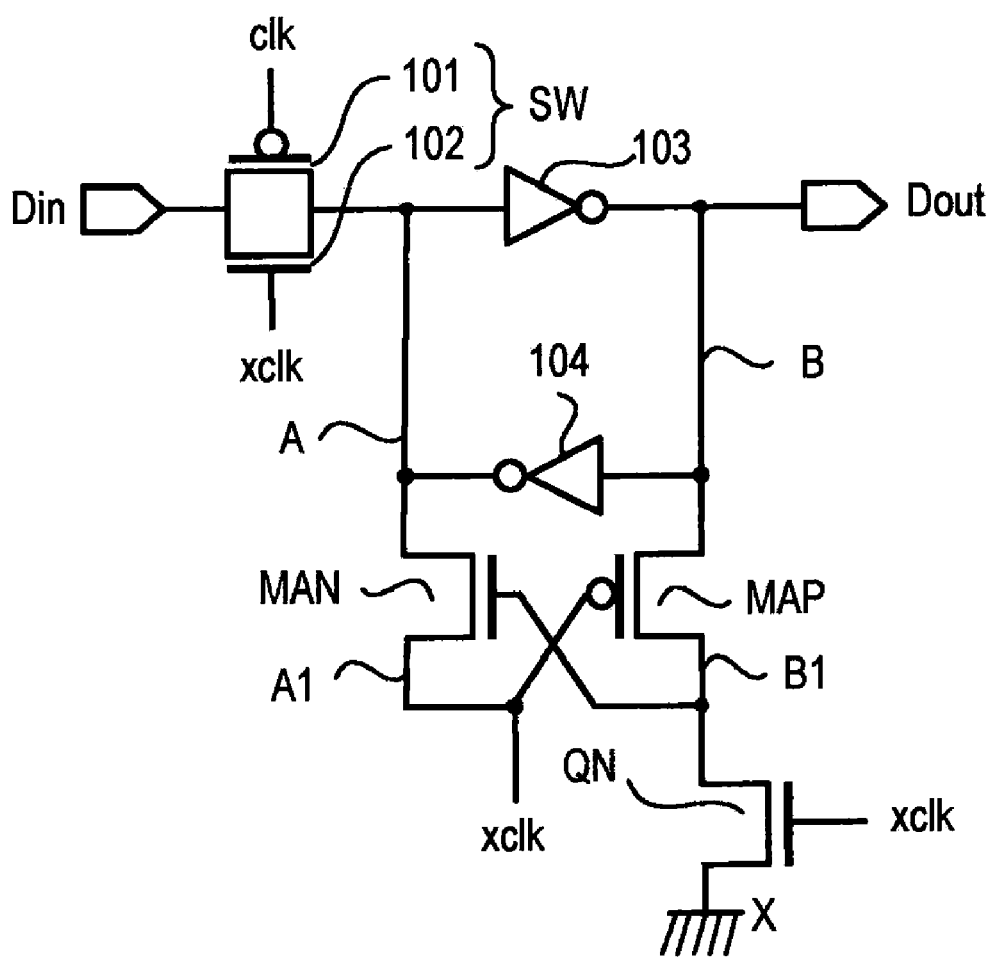
FIG. 7 is a circuit diagram showing a configuration example of a semiconductor device having a latch circuit according to a sixth embodiment.

FIG. 7 is a circuit diagram showing a configuration example of a semiconductor device having a latch circuit according to a sixth embodiment. Hereinafter, the differences of this embodiment from the second embodiment will be explained. The circuit in FIG. 7 corresponds to the circuit in FIG. 3 with an n-channel transistor QN added. The drain of the n-channel transistor QN is connected to the gate of an n-channel transistor MAN and the gate is connected to a clock signal xclk, the source is connected to a node X. Node X is a node of ground potential (low level potential). Node A1 is a node of the gate of a p-channel transistor MAP. Node B1 is a node of the gate of the n-channel transistor MAN.

When the clock signal xclk is "0," a switch SW turns OFF and a data holding state is set. At this moment, the n-channel transistor QN turns OFF, and therefore, the circuit becomes the same circuit in FIG. 3 and operates in the same way as in the second embodiment.

On the other hand, when the clock signal xclk is "1," the switch SW turns ON and a data write state is set. At this moment, the transistor MAP turns OFF. Furthermore, the transistor QN turns ON and the low level node X is connected to the gate of the transistor MAN. This causes the transistor MAN to turn OFF. Since this ensures that the transistors MAN and MAP turn OFF, the data of a data input terminal Din can be stably written into the data holding nodes A and B.

Node X may also be a node of a clock signal clk instead of the node of ground potential. The clock signal clk is a signal which becomes low level when the transistor QN is ON.

Seventh Embodiment

Figure 8:
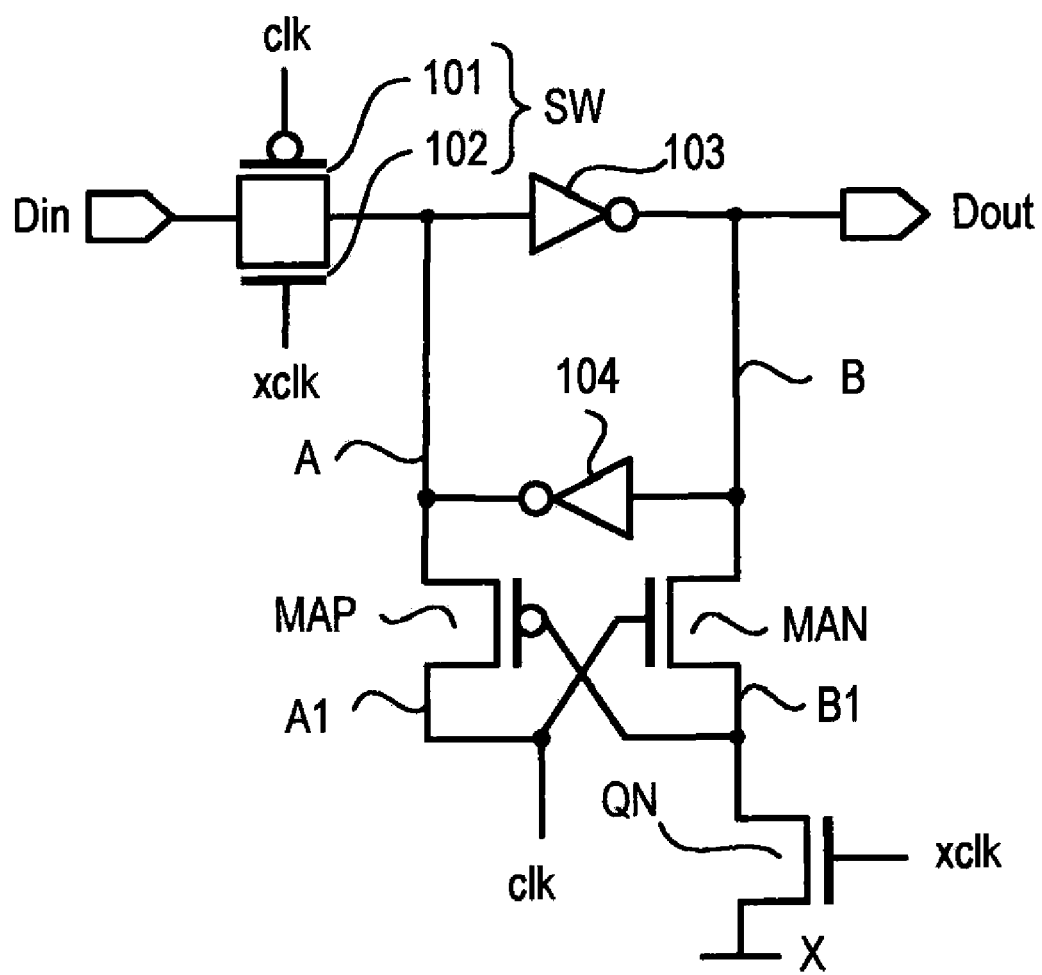
FIG. 8 is a circuit diagram showing a configuration example of a semiconductor device having a latch circuit according to a seventh embodiment.

FIG. 8 is a circuit diagram showing a configuration example of a semiconductor device having a latch circuit according to a seventh embodiment. Hereinafter, the differences of this embodiment from the third embodiment will be explained. The circuit in FIG. 8 corresponds to the circuit in FIG. 4 with an n-channel transistor QN added. The source of the n-channel transistor QN is connected to the gate of a p-channel transistor MAP, the gate is connected to a clock signal xclk and the drain is connected to a node X. Node X is a node of a supply voltage (high level potential). Node A1 is a node of the gate of an n-channel transistor MAN. Node B1 is a node of the gate of the p-channel transistor MAP.

When a clock signal clk is "1" and the clock signal xclk is "0," a switch SW turns OFF and a data holding state is set. At this moment, since the n-channel transistor QN turns OFF, the circuit becomes the same circuit in FIG. 4 and operates in the same way as in the third embodiment.

On the other hand, when the clock signal clk is "0" and clock signal xclk is "1," the switch SW turns ON and a data write state is set. At this moment, the transistor MAN turns OFF. Furthermore, the transistor QN turns ON and the high level node X is connected to the gate of the transistor MAP. This causes the transistor MAP to turn OFF. Since this ensures that the transistors MAN and MAP turn OFF, the data of a data input terminal Din can be stably written into data holding nodes A and B.

Node X may also be a node of a clock signal xclk instead of the node of the supply voltage. The clock signal xclk is a signal which becomes a high level when the transistor QN is ON.

Eighth Embodiment

Figure 9:
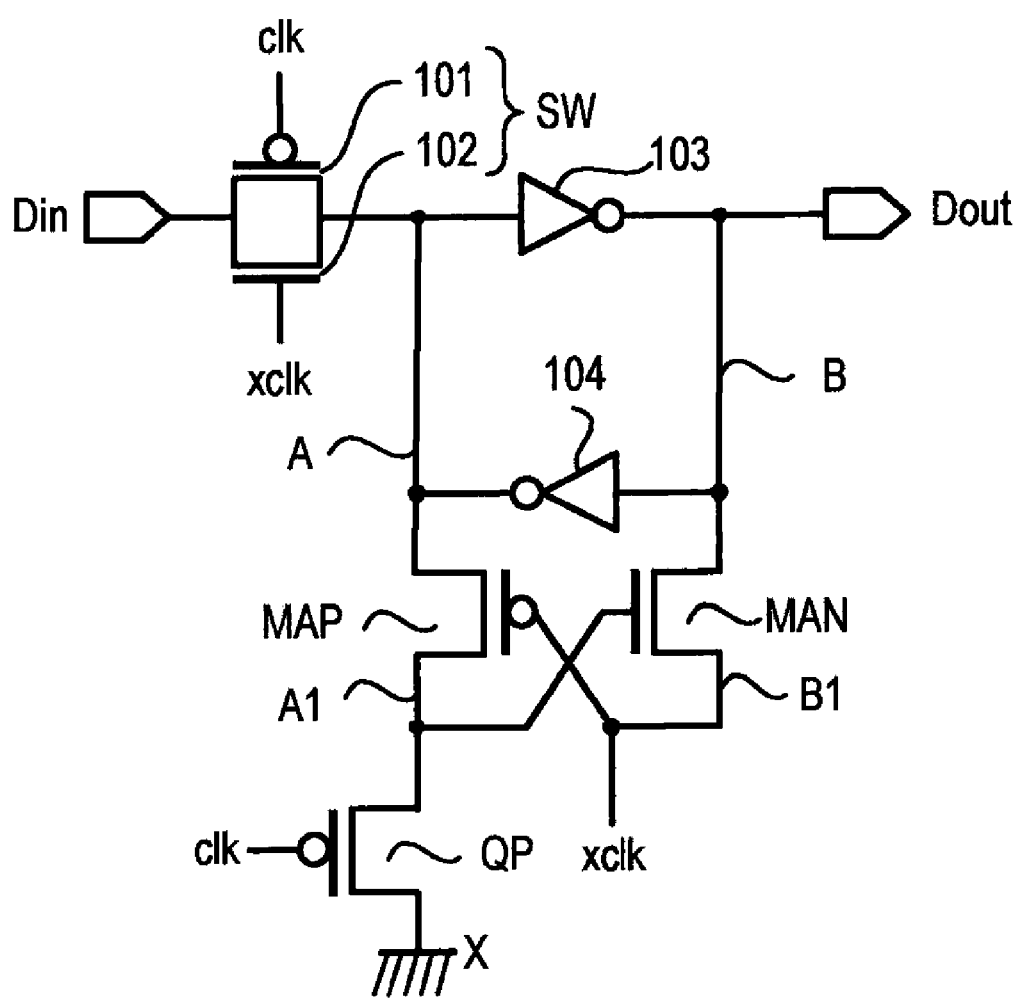
FIG. 9 is a circuit diagram showing a configuration example of a semiconductor device having a latch circuit according to an eighth embodiment.

FIG. 9 is a circuit diagram showing a configuration example of a semiconductor device having a latch circuit according to an eighth embodiment. Hereinafter, the differences of this embodiment from the fourth embodiment will be explained. The circuit in FIG. 9 corresponds to the circuit in FIG. 5 with a p-channel transistor QP added. The source of the p-channel transistor QP is connected to the gate of an n-channel transistor MAN and the gate is connected to a clock signal clk and the drain is connected to a node X. Node X is a node of ground potential (low level potential). Node A1 is a node of the gate of the n-channel transistor MAN. Node B1 is a node of the gate of a p-channel transistor MAP.

When a clock signal xclk is "0" and the clock signal clk is "1," a switch SW turns OFF and a data holding state is set. At this moment, since the p-channel transistor QP turns OFF, the circuit becomes the same circuit in FIG. 5 and operates in the same way as in the fourth embodiment.

On the other hand, when the clock signal xclk is "1" and the clock signal clk is "0," the switch SW turns ON and a data write state is set. At this moment, the transistor MAP turns OFF. Furthermore, the transistor QP turns ON and the low level node X is connected to the gate of the transistor MAN. This causes the transistor MAN to turn OFF. Since this ensures that the transistors MAN and MAP turn OFF, the data of a data input terminal Din can be stably written into data holding nodes A and B.

Node X may also be a node of a clock signal clk instead of the node of ground potential. The clock signal clk is a signal which becomes a low level when the transistor QP is ON.

Ninth Embodiment

FIG. 10A is a circuit diagram showing a configuration example of a semiconductor device having a latch circuit according to a ninth embodiment and is a combination of the first embodiment and the third embodiment.

Transistors MANa and MAPa correspond to the first embodiment. The drain of the n-channel transistor MANa is connected to a data holding node A, the gate is connected to the drain of the p-channel transistor MAPa and the source is connected to the gate of the p-channel transistor MAPa. The source of the p-channel transistor MAPa is connected to a data holding node B. A clock signal clk is inputted to the gate of the transistor MANa.

Transistors MANb and MAPb correspond to the third embodiment. The source of the p-channel transistor MAPb is connected to the data holding node A, the gate is connected to the source of the n-channel transistor MANb and the drain is connected to the gate of the n-channel transistor MANb. The drain of the n-channel transistor MANb is connected to the data holding node B. A clock signal clk is inputted to the gate of the transistor MANb.

The first embodiment is a circuit effective when the data holding node B holds "1" and the third embodiment is a circuit effective when the data holding node A holds "1." This embodiment is a circuit combining the first and third embodiments. Therefore, in any case whether the data holding node A holds "1" or the data holding node B holds "1," this embodiment increases noise resistance and can effectively prevent soft errors.

Tenth Embodiment

FIG. 10B is a circuit diagram showing a configuration example of a semiconductor device having a latch circuit according to a tenth embodiment and is a combination of the second embodiment and the third embodiment.

Transistors MANa and MAPa correspond to the second embodiment. The drain of the n-channel transistor MANa is connected to a data holding node A, the gate is connected to the drain of the p-channel transistor MAPa and the source is connected to the gate of the p-channel transistor MAPa. The source of the p-channel transistor MAPa is connected to a data holding node B. A clock signal xclk is inputted to the gate of the transistor MAPa.

Transistors MANb and MAPb correspond to the third embodiment. The source of the p-channel transistor MAPb is connected to the data holding node A, the gate is connected to the source of the n-channel transistor MANb and the drain is connected to the gate of the n-channel transistor MANb. The drain of the n-channel transistor MANb is connected to the data holding node B. A clock signal clk is inputted to the gate of the transistor MANb.

The second embodiment is a circuit effective when the data holding node B holds "1" and the third embodiment is a circuit effective when the data holding node A holds "1." This embodiment is a circuit combining the second and third embodiments. Therefore, this embodiment can increase noise resistance and effectively prevent soft errors in any case whether the data holding node A holds "1" or the data holding node B holds "1."

Eleventh Embodiment

FIG. 10C is a circuit diagram showing a configuration example of a semiconductor device having a latch circuit according to an eleventh embodiment and is a combination of the second embodiment and the fourth embodiment.

Transistors MANa and MAPa correspond to the second embodiment. The drain of the n-channel transistor MANa is connected to a data holding node A, the gate is connected to the drain of the p-channel transistor MAPa and the source is connected to the gate of the p-channel transistor MAPa. The source of the p-channel transistor MAPa is connected to a data holding node B. A clock signal xclk is inputted to the gate of the transistor MAPa.

Transistors MANb and MAPb correspond to the fourth embodiment. The source of the p-channel transistor MAPb is connected to the data holding node A, the gate is connected to the source of the n-channel transistor MANb and the drain is connected to the gate of the n-channel transistor MANb. The drain of the n-channel transistor MANb is connected to the data holding node B. A clock signal xclk is inputted to the gate of the transistor MAPb.

The second embodiment is a circuit effective when the data holding node B holds "1" and the fourth embodiment is a circuit effective when the data holding node A holds "1." This embodiment is a circuit combining the second and fourth embodiments. Therefore, this embodiment can increase noise resistance and prevent soft errors more effectively in any case whether the data holding node A holds "1" or the data holding node B holds "1."

As in the cases of the ninth to eleventh embodiments, other two embodiments can also be combined. The first, second, fifth and sixth embodiments are circuits effective when the data holding node B holds "1" and the third, fourth, seventh and eighth embodiments are circuits effective when the data holding node A holds "1." At least one circuit of the first, second, fifth and sixth embodiments can be combined with at least one circuit of the third, fourth, seventh and eighth embodiments. This can increase noise resistance and prevent soft errors more effectively in any case whether the data holding node A holds "1" or the data holding node B holds "1."

Twelfth Embodiment

Figure 11A:
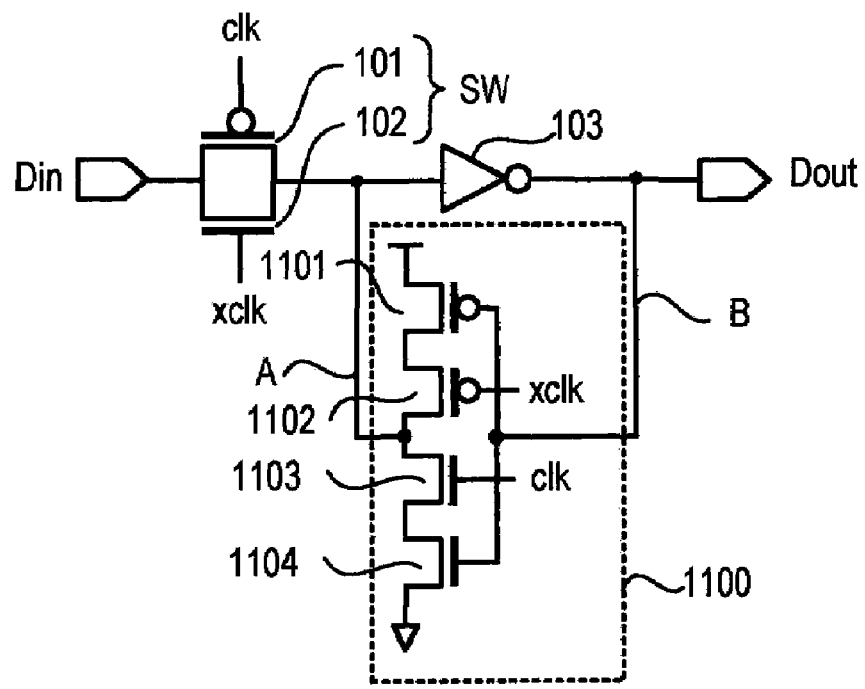
FIG. 11A and 11B are circuit diagrams showing configuration examples of other semiconductor devices.
Figure 11B:
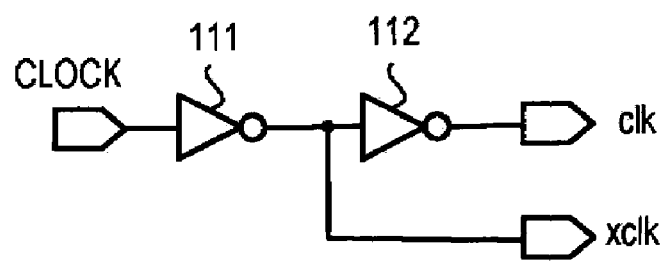

FIGS. 11A and 11B are circuit diagrams showing configuration examples of another semiconductor device. FIG. 11A is a circuit diagram showing a configuration example of a circuit having a latch circuit and FIG. 11B is a circuit diagram showing a configuration example of a clock generation circuit. FIG. 11A corresponds to FIG. 12A provided with a clock gate 1100 instead of the inverter 104. The circuit in FIG. 11B is the same as the circuit in FIG. 12B.

Next, the configuration of the clock gate 1100 will be explained. The source of a p-channel transistor 1101 is connected to a supply voltage, the gate is connected to a data holding node B and the drain is connected to the source of a p-channel transistor 1102. The gate of the p-channel transistor 1102 is connected to a clock signal xclk and the drain is connected to a data holding node A. The drain of an n-channel transistor 1103 is connected to the data holding node A and the gate is connected to a clock signal clk and the source is connected to the drain of an n-channel transistor 1104. The gate of the n-channel transistor 1104 is connected to the data holding node B and the source is connected to a ground potential (reference potential).

When the clock signal xclk is "1" and the clock signal clk is "0," a switch SW turns ON and a data write state is set. At that moment, since the transistors 1102 and 1103 turn OFF, the output of the clock gate 1100 is set to a high impedance state with respect to the data holding node A. This allows the data of a data input terminal Din to be stably written into the data holding nodes A and B.

On the other hand, when the clock signal xclk is "0" and clock signal clk is "1," the switch SW turns OFF and a data holding state is set. At that moment, since the transistors 1102 and 1103 turn ON, the clock gate 1100 has the same configuration as that of the inverter 104 in FIG. 12A. That is, the circuit in FIG. 11A has the same circuit configuration and operates in the same way as the circuit in FIG. 12A.

The circuits in FIGS. 11A and 11B in the data write and data holding states operate in the same way as in the timing chart in FIG. 12C. That is, even when the inverter 104 in FIG. 12A is replaced by the clock gate 1100 in FIG. 11A, the circuit in FIG. 11A operates in the same way as the circuit in FIG. 12A.

The twelfth embodiment is configured as a semiconductor device with the inverter 104 in the first to eleventh embodiments replaced by the clock gate 1100. For example, the transistors MAN and MAP in FIG. 1A can be added to the circuit in FIG. 11A. The first to eleventh embodiments can perform the same operation even when the inverter 104 is replaced by the clock gate 1100.

As shown above, the semiconductor device according to the first to twelfth embodiments includes a latch circuit having a first data holding node and a second data holding node, a first MOS field-effect transistor connected to the first data holding node, a second MOS field-effect transistor connected to the second data holding node and a clock generation circuit connected to a gate electrode of the first MOS field-effect transistor that generates and outputs a clock signal, wherein the gate electrode of the first MOS field-effect transistor is connected to the second data holding node via the second MOS field-effect transistor and the gate electrode of the second MOS field-effect transistor is connected to the first data holding node via the first MOS field-effect transistor.

For example, the latch circuit is constructed of the inverters 103 and 104 in the first to eleventh embodiments and is constructed of the inverter 103 and clock gate 1100 in the twelfth embodiment. The latch circuit may have a different configuration. The clock generation circuit is the clock generation circuit in FIG. 1B.

In the first embodiment, the first MOS field-effect transistor is the transistor MAN, the second MOS field-effect transistor is the transistor MAP, the first data holding node is the data holding node A and the second data holding node is the data holding node B.

In the second embodiment, the first MOS field-effect transistor is the transistor MAP, the second MOS field-effect transistor is the transistor MAN, the first data holding node is the data holding node B and the second data holding node is the data holding node A.

The first switch element SW is provided on the input line of the latch circuit. The first switch element SW is controlled by the clock generation circuit. The latch circuit has a loop circuit including the plurality of inverters 103 and 104 or the like.

At least one of the gate electrode of the first MOS field-effect transistor and the gate electrode of the second MOS field-effect transistor is connected to a fixed potential power line via the second switch element QP or QN.

In the clock generation circuit, the second switch element QP or QN turns ON for at least part of the period during which the first switch element SW is ON.

The first and second data holding nodes hold mutually inverted data. The first and second MOS field-effect transistors have mutually reverse conducting channels. For example, in the first embodiment, the first MOS field-effect transistor MAN has an n-channel and the second MOS field-effect transistor MAP has a p-channel.

In the first embodiment or the like, the first switch element SW is connected to the first data holding node A and controlled according to the clock signal or an inverted signal of the clock signal. The first switch element SW may be configured by any one of the transistors 101 and 102. For example, in the first embodiment, the first switch element SW is controlled according to a clock signal clk or an inverted signal xclk of the clock signal.

In the second embodiment or the like, the first switch element SW is connected to the second data holding node A and controlled by the clock signal or an inverted signal of the clock signal.

The gate electrode of the second MOS field-effect transistor is connected to a fixed potential line (supply voltage line or ground potential line) or the line of an inverted signal of the clock signal via the second switch element QP or QN.

The first switch element SW and second switch element QP or QN perform the same ON/OFF operation.

According to the above described embodiments, the gate capacitance of the first or second MOS field-effect transistor can be connected to the latch circuit, and it is thereby possible to reduce the soft error rate of the latch circuit. Furthermore, the soft error rate of the latch circuit can be reduced by connecting the clock generation circuit. This allows the reliability of the latch circuit to improve.

The above described embodiments merely illustrate specific examples of implementing the present invention and the technical scope of the present invention should by no means be interpreted in a limited way by these embodiments. That is, the present invention can be implemented in various ways without departing from its technical thought or its main features.

What is claimed:

1. A semiconductor device comprising:
  a circuit having a first data holding node and a second data holding node;
  a first MOS field-effect transistor coupled to the first data holding node;
  a second MOS field-effect transistor coupled to the second data holding node; and
  a clock generation circuit coupled to a first gate electrode of the first MOS field-effect transistor for outputting a clock signal,
  wherein the first gate electrode is coupled to the second data holding node via the second MOS field-effect transistor, and a second gate electrode of the second MOS field-effect transistor is coupled to the first data holding node via the first MOS field-effect transistor.

2. The semiconductor device according to claim 1, wherein at least one of the first gate electrode and the second gate electrode is coupled to a fixed potential power line via a second switch element, and the second switch element turns ON for at least part of a period during which the first switch element is ON.

3. The semiconductor device according to claim 1, wherein the circuit is a latch circuit having a loop circuit including a plurality of inverters.

4. The semiconductor device according to claim 1, wherein at least one of the first gate electrode and the second gate electrode is coupled to a fixed potential power line via a second switch element.

5. The semiconductor device according to claim 1, further comprising a first switch element provided on an input line of the circuit, wherein the first switch element is controlled by the clock generation circuit.

6. The semiconductor device according to claim 5, wherein the first and second data holding nodes hold mutually inverted data, and the first and second MOS field-effect transistors have mutually reverse conducting channels.

7. The semiconductor device according to claim 6, wherein the first switch element is coupled to the second data holding node and controlled according to the clock signal or an inverted signal of the clock signal.

8. The semiconductor device according to claim 6, wherein the first switch element is coupled to the first data holding node and controlled according to the clock signal or an inverted signal of the clock signal.

9. The semiconductor device according to claim 8, wherein the second gate electrode is coupled to a fixed potential line or a line of an inverted signal of the clock signal via a second switch element.

10. The semiconductor device according to claim 9, wherein the first and second switch elements perform the same ON/OFF operation.

* * * * *